(12) United States Patent
Anshumali et al.

(10) Patent No.: US 6,828,838 B1
(45) Date of Patent: Dec. 7, 2004

(54) VECTORED FLIP-FLOPS AND LATCHES WITH EMBEDDED OUTPUT-MERGE LOGIC AND SHARED CLOCK DRIVERS

(75) Inventors: Kumar A. Anshumali, Hillsboro, OR (US); Thomas D. Fletcher, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/448,426

(22) Filed: May 30, 2003

(51) Int. Cl.[7] .................. H03K 3/356; H03K 3/286
(52) U.S. Cl. ................ 327/208; 327/211; 327/218
(58) Field of Search ..................... 327/202, 203, 327/200, 208, 209, 210, 211, 218, 199

(56) References Cited

U.S. PATENT DOCUMENTS

| | | | | |
|---|---|---|---|---|
| 5,349,243 A | * | 9/1994 | McClure | 327/108 |
| 5,396,108 A | * | 3/1995 | McClure | 327/108 |
| 5,949,266 A | * | 9/1999 | Hinds et al. | 327/208 |
| 6,107,852 A | * | 8/2000 | Durham et al. | 327/203 |
| 6,111,444 A | * | 8/2000 | Mikan et al. | 327/211 |
| 6,242,958 B1 | | 6/2001 | Fletcher | 327/202 |
| 6,331,793 B1 | | 12/2001 | Fletcher et al. | 327/51 |
| 6,492,855 B1 | * | 12/2002 | Pasqualini | 327/211 |
| 6,617,902 B2 | * | 9/2003 | Tokumasu et al. | 327/211 |

* cited by examiner

*Primary Examiner*—Tuan T. Lam
(74) *Attorney, Agent, or Firm*—Fleshner & Kim, LLP

(57) ABSTRACT

A logic cell includes a shared clock driver to drive vectored sequential logic elements such as flip-flops and latches with merged outputs. In one embodiment, a logic cell includes a clock signal directly input to the flip-flops, which act as a passgate for latches. The clock signal is also input to a single inverter whose output drives the flip-flops. The outputs of the flip-flops are input into one or more logic gates embedded within the cell. The logic gates generate logical outputs for data signals input to the cell.

37 Claims, 11 Drawing Sheets

VECTORED FLIP-FLOPS AND LATCHES WITH EMBEDDED OUTPUT-MERGE LOGIC AND SHARED CLOCK DRIVERS

BACKGROUND OF THE INVENTION

1. Field of the Invention

An embodiment of the present invention relates to sequential logic elements. In particular, an embodiment of the present invention relates to vectored flip-flops and latches with embedded output-merge logic and shared clock drivers.

2. Background of the Related Art

Integrated circuits are widely used in many applications. One example of an integrated circuit is a microprocessor, which has many applications. Within microprocessors are datapaths called pipestages. These pipestages are datapaths for data signals and can be configured for various logic arrangements. The length of a pipestage dictates the amount of time a data signal takes to travel the datapath and arrive at an output. The shorter the pipestage, the faster a data signal can be processed.

Within the pipestage are various logic stages the data signal must travel through to implement the desired logic arrangement. Two common logic stages are flip-flops and latches. Each logic stage requires a certain amount of time to complete. In conventional designs, the delay (datapath penalty) of going through a flip-flop and/or latch has become too large because of input and output inverters of the driver elements within the pipestage. For example, a ten logic stage design from the passgate output of a latch to the passgate input of the next latch may go through two wasted stages: one output inverter of the driver element, and one input inverter of the receiver element. For a microprocessor with even shorter number of logic stages per pipestage, such as six logic gates/pipestage, two may be wasted, which is a 1/3rd loss of that pipestage.

Another area of concern in conventional microprocessors is the power consumption. For example, in a microprocessor with pushed frequencies, the number of storage elements (flip-flops/latches) can become very large. Thus, the storage elements become a significant contributor to the total power consumption of the microprocessor. A large proportion of total microprocessor power (>~30%) comes from load residing within sequential cells, of which more than half is in the local clock drivers and their loads. Often, these clock-drivers tend to underflow (become clamped to lowest allowable size value) because the passgates they drive are small enough already. However, they still consume power.

These and other disadvantages exist in conventional circuitry.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
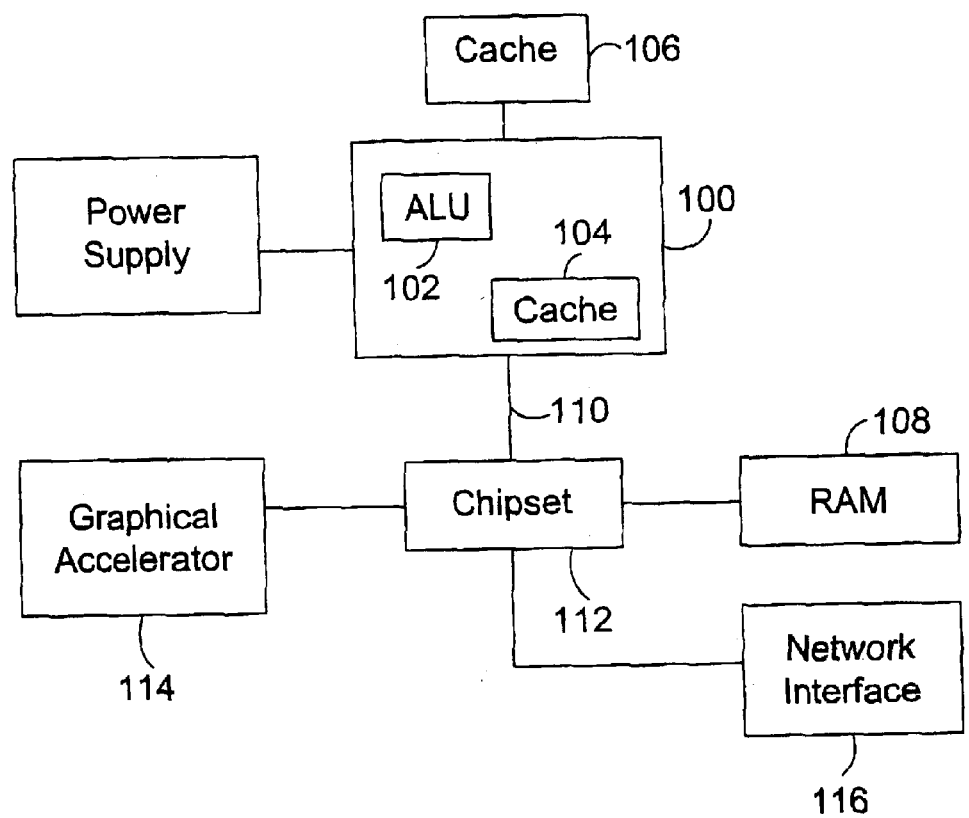
FIG. 1 illustrates an example of a computer system.

In the following detailed description of preferred embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized, and structural, logical, and intellectual changes may be made without departing from the scope of the present invention. Moreover, it is to be understood that various embodiments of the invention, although different, are not necessarily mutually exclusive. For example, a particular feature, structure, or characteristic described in one embodiment may be included within other embodiments. The following detailed description is not to be taken in a limiting sense, and the scope of the present invention is defined only by appended claims, along with the full scope of equivalence to which such claims are entitled.

An embodiment of the present invention relates to sequential logic elements (such as flip-flops and latches) for use in a wide variety of applications including computer systems. FIG. 1 shows an exemplary illustration of a computer system. The computer system may include a microprocessor 100, which can include many sub-blocks such as an arithmetic logic unit (ALU) 102 and an on-die cache 104. The microprocessor 100 may also communicate to other levels of cache, such as off-die cache 106. Higher memory hierarchy levels such as system memory 108 may be accessed via host bus 110 and a chip set 112. In addition, other off-die functional units such as a graphics accelerator 114 and a network interface controller 116, to name just a few, may communicate with the microprocessor 100 via appropriate busses or ports.

Figure 2:
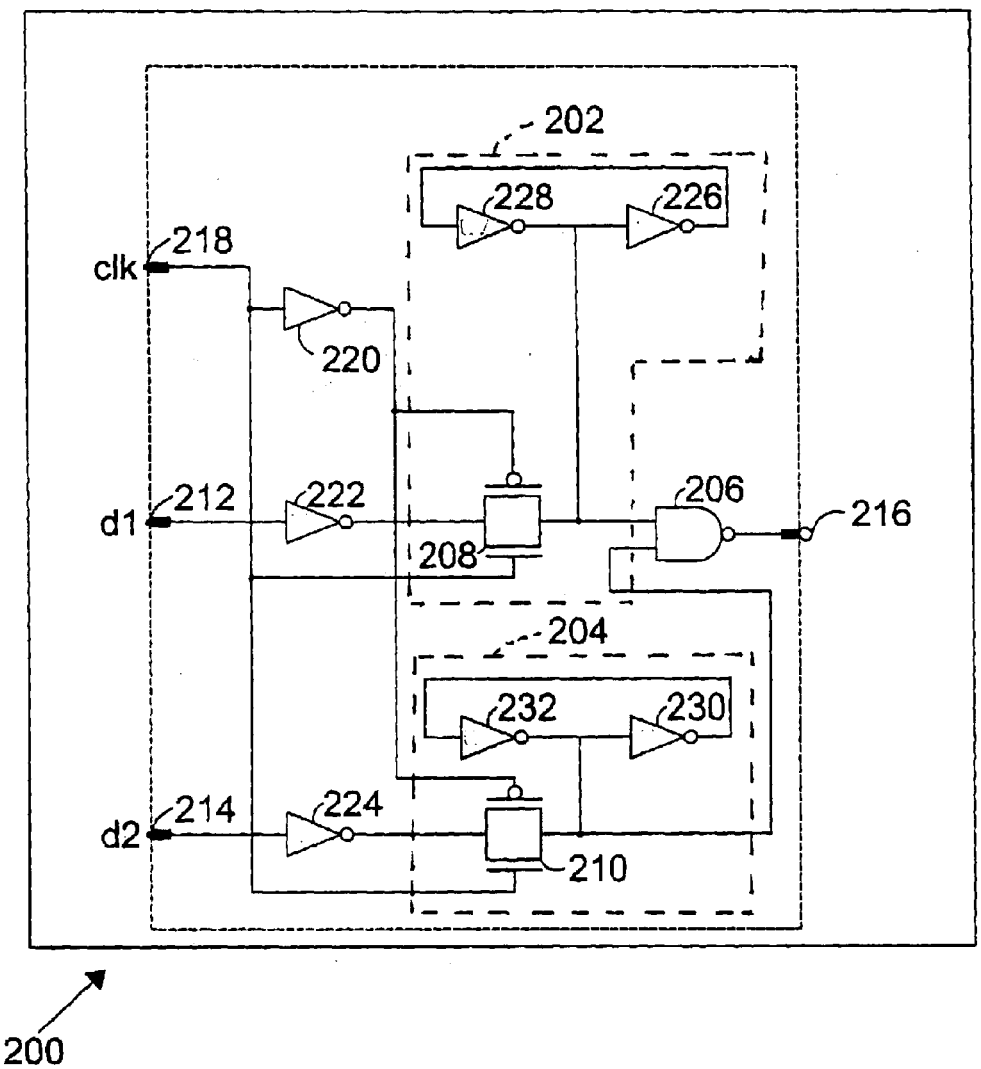
FIG. 2 illustrates a two input NAND gate with n-first latches according to one embodiment of the present invention.

FIG. 2 shows an embodiment of the present invention using vectored (grouped/ganged) latches. In this embodiment, a shared clock-driver is used between multiple latches to avoid local clock driver underflow, the outputs of the multiple latches contained within this cell are merged into a logic type (nand2) to provide one output, and the combination is created as a standard cell that is fully electrically characterizable and usable for timing analysis and layout placement. This arrangement provides a higher average logical effort per pipestage since the previous inaccessible inverting stages within latches are now allowed to be logic-gates, a lower overall clock load because the clock driver is now shared between multiple gates, and the circuit remains electrically characterizable and placeable as a standard cell.

In FIG. 2, a logic cell 200 includes a first latch 202, a second latch 204, a NAND gate 206, a first passgate 208 of the first latch 202, and a second passgate 210 of the second latch 204. The first latch 202 acts as a memory latch for a first data signal (d1) 212 that is input to the gate 206. The second latch 204 acts as a memory latch for a second data signal (d2) 214 that is input to the gate 206. The gate 206 performs a logical operation (NAND) on the two inputs, 212 and 214, to generate output 216.

Cell 200 includes a clock signal 218 that is directly input to the passgates 208 and 210. In this embodiment, the latches 202 and 204 are configured as n-first latches by directly inputting clock signal 218 into the n-inputs of the latches (passgates for the latches) 202 and 204. However, it should be understood that the latches 202 and 204 may be configured as p-first latches by directly driving the clock signal 218 into the p-inputs of the passgates 208 and 210. Clock signal 218 is also input to an inverter 220, which outputs an inverted clock signal to each passgate 208 and 210 for driving both passgates. By using a single inverter 220 to drive both passgates 208 and 210, the power consumption of cell 200 is reduced. The output of inverter 220 is input into the p-inputs of passgates 208 and 210. As discussed above, the output of inverter 220 can be input into the n-inputs of the passgates for a p-first latch configuration.

The data signal 212 is input to a first inverter 222 to drive the data signal 212 into passgate 208. The data signal 214 is input to a second inverter 224 to drive the data signal 214 into passgate 210. The passgates 208 and 210 act as gates for data signals 212 and 214 by holding the data until a high clock signal 218 is input to the passgates. Once the high clock signal is input to the passgates 208 and 210, the data signals 212 and 214 are allowed to pass. The data signals 212 and 214 are then input into respective latches 202 and 204 as well as gate 206. The gate 206 performs a logic operation on data signals 212 and 214 and generates output 216. Latches 202 and 204 can be configured in many ways. In this embodiment, latch 202 includes an inverter 226 that receives data signal 212 as an input after it passes passgate 208 (also part of latch 202). Latch 202 also includes an inverter 228 that receives the output of inverter 226. Latch 204 includes an inverter 230 that receives data signal 214 as an input after it passes passgate 210 (also part of latch 204). Latch 204 also includes an inverter 232 that receives the output of inverter 230.

Figure 3:
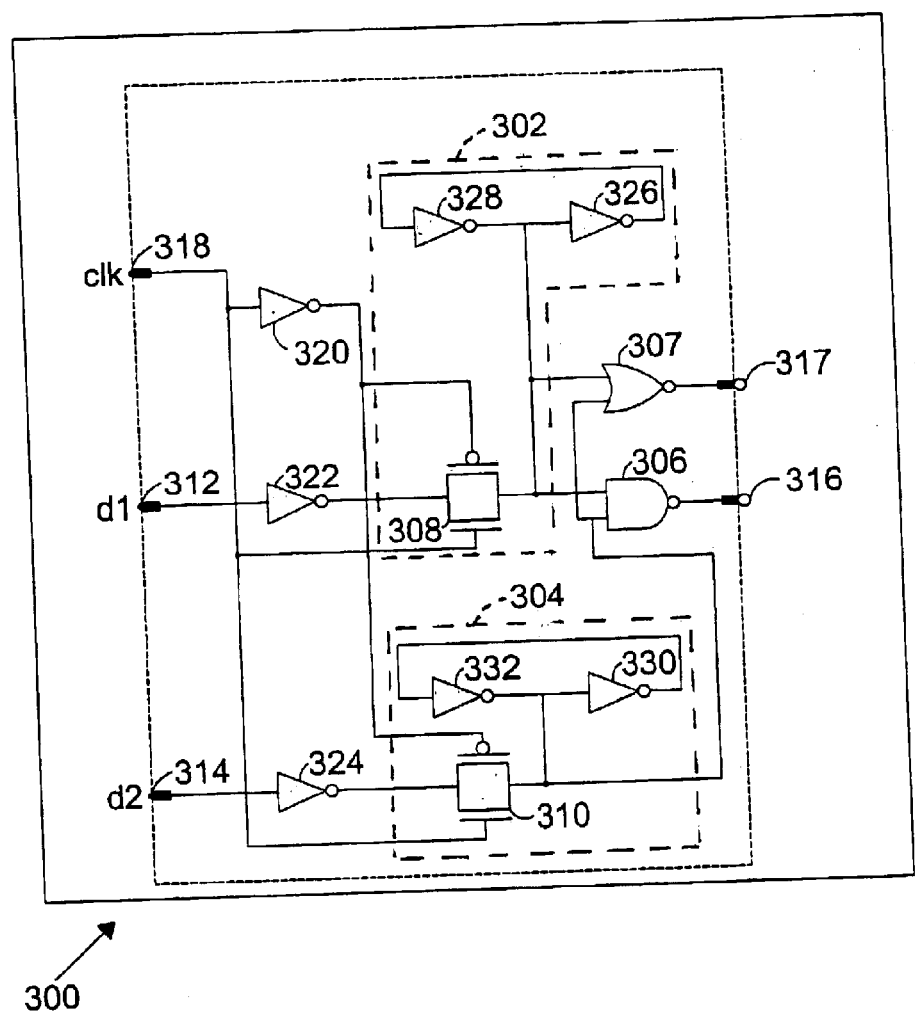
FIG. 3 illustrates a two input NAND gate and two input NOR gate with n-first latches according to one embodiment of the present invention.

FIG. 3 shows an embodiment of the present invention. In FIG. 3, a logic cell 300 includes a first latch 302, a second latch 304, a NAND gate 306, a NOR gate 307, a first passgate 308 of the first latch 302, and a second passgate 310 of the second latch 304. The first latch 302 acts as a memory latch for a first data signal (d1) 312 that is input to the gates 306 and 307. The second latch 304 acts as a memory latch for a second data signal (d2) 314 that is input to the gates 306 and 307. The gates 306 and 307 perform logical operations (NAND and NOR) on the two inputs, 312 and 314, to generate output 316 for gate 306 and output 317 for gate 307.

Cell 300 includes a clock signal 318 that is directly input to the passgates 308 and 310. In this embodiment, the latches 302 and 304 are configured as n-first latches by directly inputting clock signal 318 into the n-inputs of the latches (passgates for the latches) 302 and 304. However, it should be understood that the latches 302 and 304 can be configured as p-first latches by directly driving the clock signal 318 into the p-inputs of the passgates 308 and 310. Clock signal 318 is also input to an inverter 320, which outputs an inverted clock signal to each passgate 308 and 310 for driving both passgates. By using a single inverter 320 to drive both passgates 308 and 310, the power consumption of cell 300 is reduced. The output of inverter 320 is input into the p-inputs of passgates 308 and 310. As discussed above, the output of inverter 320 can be input into the n-inputs of the passgates for a p-first latch configuration.

The data signal 312 is input to a first inverter 322 to drive the data signal 312 into passgate 308. The data signal 314 is input to a second inverter 324 to drive the data signal 314 into passgate 310. The passgates 308 and 310 act as gates for data signals 312 and 314 by holding the data until a high clock signal 318 is input to the passgates. Once the high clock signal is input to the passgates 308 and 310, the data signals 312 and 314 are allowed to pass. The data signals 312 and 314 are then input into respective latches 302 and 304 as well as gates 306 and 307. The gates 306 and 307 perform a logic operation on data signals 312 and 314 and generate outputs 316 and 317. Latches 302 and 304 can be configured in many ways. In this embodiment, latch 302 includes an inverter 326 that receives data signal 312 as an input after it passes passgate 308. Latch 302 also includes an inverter 328 that receives the output of inverter 326. Latch 304 includes an inverter 330 that receives data signal 314 as an input after it passes passgate 310. Latch 304 also includes an inverter 332 that receives the output of inverter 330.

Figure 4:
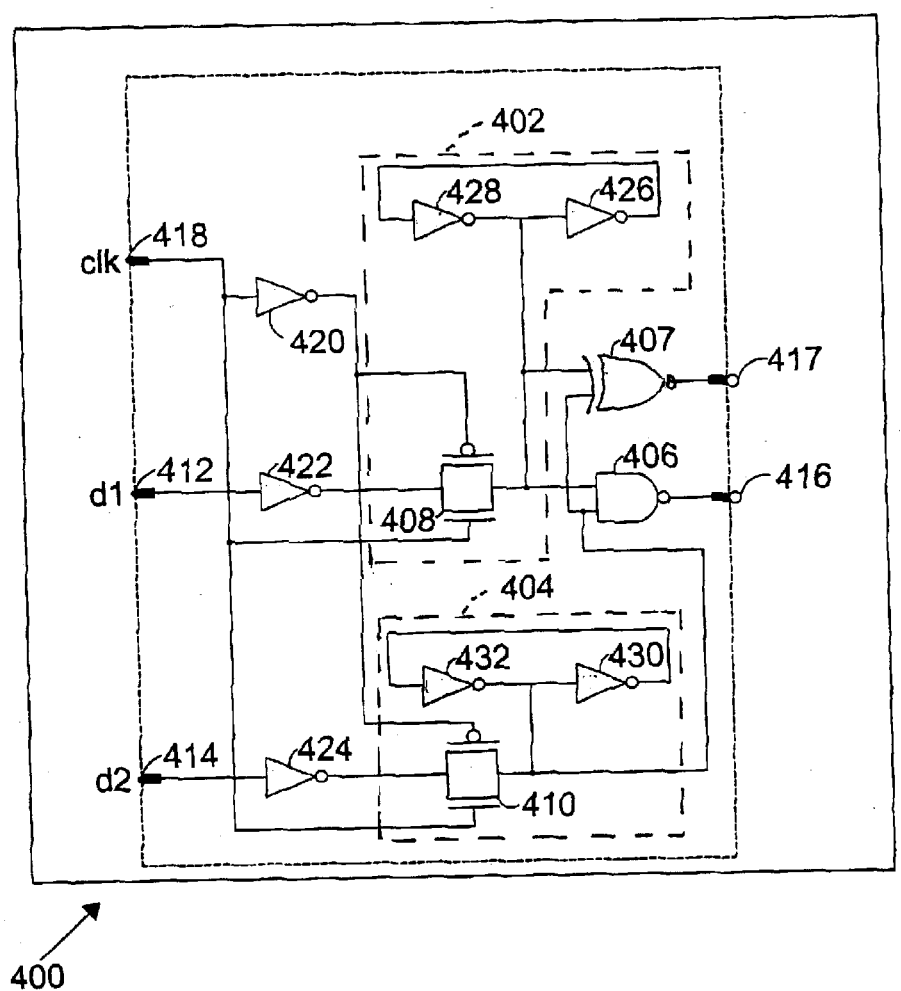
FIG. 4 illustrates a two input NAND gate and a two input XNOR gate with n-first latches according to one embodiment of the present invention.

FIG. 4 shows an embodiment of the present invention. In FIG. 4, a logic cell 400 includes a first latch 402, a second latch 404, a NAND gate 406, a XNOR gate 407, a first passgate 408 of the first latch 402, and a second passgate 410 of the second latch 404. The first latch 402 acts as a memory latch for a first data signal (d1) 412 that is input to the gates 406 and 407. The second latch 404 acts as a memory latch for a second data signal (d2) 414 that is input to the gates 406 and 407. The gates 406 and 407 perform logical operations (NAND) on the two inputs, 412 and 414, to generate output 416 for gate 406 and output 417 for gate 407.

Cell 400 includes a clock signal 418 that is directly input to the passgates 408 and 410. In this embodiment, the latches 402 and 404 are configured as n-first latches by directly inputting clock signal 418 into the n-inputs of the latches (passgates for the latches) 402 and 404. However, it should be understood that the latches 402 and 404 can be configured as p-first latches by directly driving the clock signal 418 into the p-inputs of the passgates 408 and 410. Clock signal 418 is also input to an inverter 420, which outputs an inverted clock signal to each passgate 408 and 410 for driving both passgates. By using a single inverter 420 to drive both passgates 408 and 410, the power consumption of cell 400 is reduced. The output of inverter 420 is input into the p-inputs of passgates 408 and 410. As discussed above, the output of inverter 420 can be input into the n-inputs of the passgates for a p-first latch configuration.

The data signal 412 is input to a first inverter 422 to drive the data signal 412 into passgate 408. The data signal 414 is input to a second inverter 424 to drive the data signal 414 into passgate 410. The passgates 408 and 410 act as gates for data signals 412 and 414 by holding the data until a high clock signal 418 is input to the passgates. Once the high clock signal is input to the passgates 408 and 410, the data signals 412 and 414 are allowed to pass. The data signals 412 and 414 are then input into respective latches 402 and 404 as well as gates 406 and 407. The gates 406 and 407 perform a logic operation on data signals 412 and 414 and generate outputs 416 and 417. Latches 402 and 404 can be configured in many ways. In this embodiment, latch 402 includes an inverter 426 that receives data signal 412 as an input after it passes passgate 408. Latch 402 also includes an inverter 428 that receives the output of inverter 426. Latch 404 includes an inverter 430 that receives data signal 414 as an input after it passes passgate 410. Latch 404 also includes an inverter 432 that receives the output of inverter 430.

Figure 5:
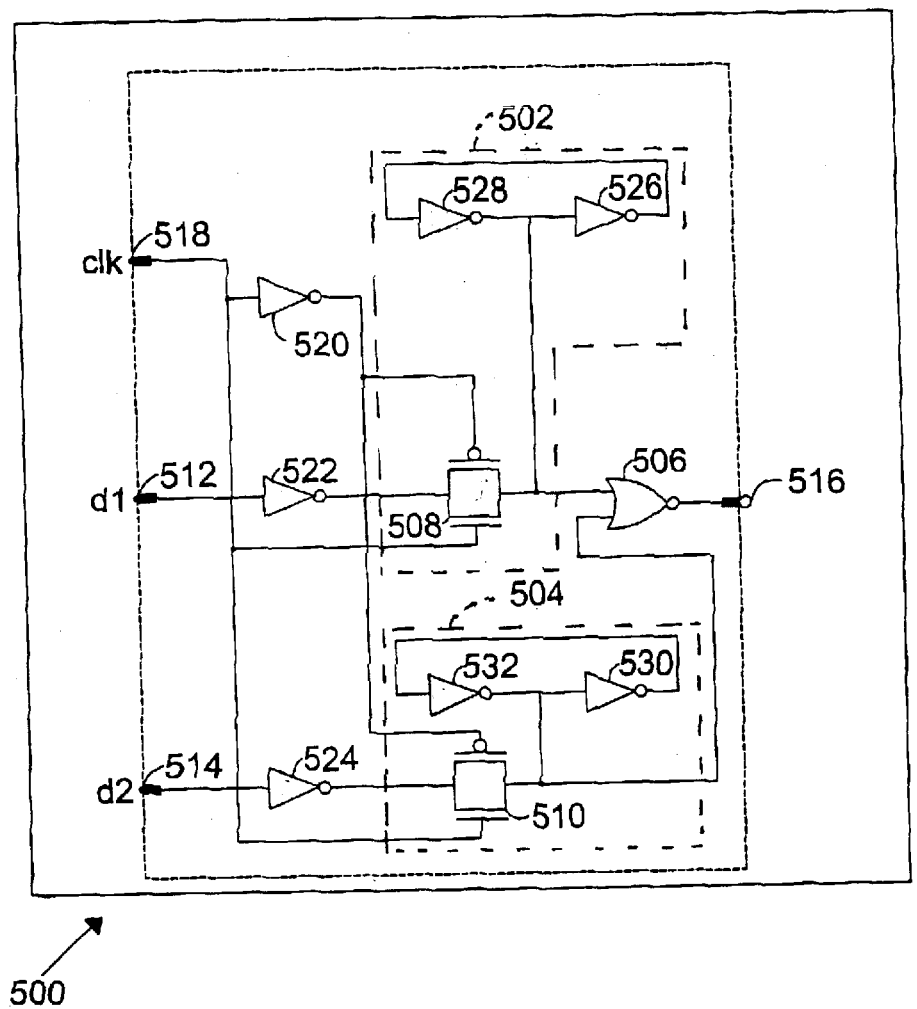
FIG. 5 illustrates a two input NOR gate with n-first latches according to one embodiment of the present invention.

FIG. 5 shows an embodiment of the present invention. In FIG. 5, a logic cell 500 includes a first latch 502, a second latch 504, a NOR gate 506, a first passgate 508 of the first latch 502, and a second passgate 510 of the second latch 504. The first latch 502 acts as a memory latch for a first data signal (d1) 512 that is input to the gate 506. The second latch 504 acts as a memory latch for a second data signal (d2) 514 that is input to the gate 506. The gate 506 performs a logical operation (NOR) on the two inputs, 512 and 514, to generate output 516.

Cell 500 includes a clock signal 518 that is directly input to the passgates 508 and 510. In this embodiment, the latches 502 and 504 are configured as n-first latches by directly inputting clock signal 518 into the n-inputs of the latches (passgates for the latches) 502 and 504. However, it should be understood that the latches 502 and 504 can be configured as p-first latches by directly driving the clock signal 518 into the p-inputs of the passgates 508 and 510. Clock signal 518 is also input to an inverter 520, which outputs an inverted clock signal to each passgate 508 and 510 for driving both passgates. By using a single inverter 520 to drive both passgates 508 and 510, the power consumption of cell 500 is reduced. The output of inverter 520 is input into the p-inputs of passgates 508 and 510. As discussed above, the output of inverter 520 can be input into the n-inputs of the passgates for a p-first latch configuration.

The data signal 512 is input to a first inverter 522 to drive the data signal 512 into passgate 508. The data signal 514 is input to a second inverter 524 to drive the data signal 514 into passgate 510. The passgates 508 and 510 act as gates for data signals 512 and 514 by holding the data until a high clock signal 518 is input to the passgates. Once the high clock signal is input to the passgates 508 and 510, the data signals 512 and 514 are allowed to pass. The data signals 512 and 514 are then input into respective latches 502 and 504 as well as gate 506. The gate 506 performs a logic operation on data signals 512 and 514 and generates output 516. Latches 502 and 504 can be configured in many ways. In this embodiment, latch 502 includes an inverter 526 that receives data signal 512 as an input after it passes passgate 508. Latch 502 also includes an inverter 528 that receives the output of inverter 526. Latch 504 includes an inverter 530 that receives data signal 514 as an input after it passes passgate 510. Latch 504 also includes an inverter 532 that receives the output of inverter 530.

Figure 6:
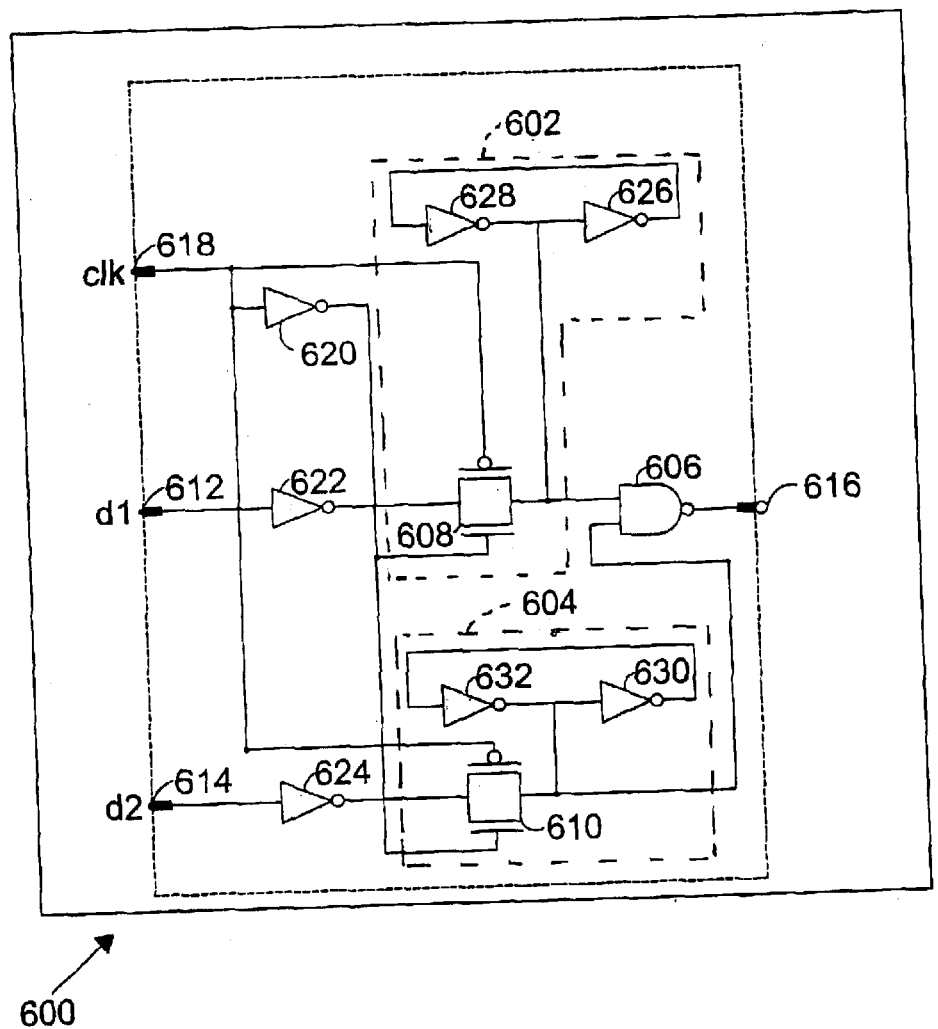
FIG. 6 illustrates a two input NAND gate with p-first latches according to one embodiment of the present invention.

FIG. 6 shows an embodiment of the present invention. In FIG. 6, a logic cell 600 includes a first latch 602, a second latch 604, a NAND gate 606, a first passgate 608 of the first latch 602, and a second passgate 610 of the second latch 604. The first latch 602 acts as a memory latch for a first data signal (d1) 612 that is input to the gate 606. The second latch 604 acts as a memory latch for a second data signal (d2) 614 that is input to the gate 606. The gate 606 performs a logical operation (NAND) on the two inputs, 612 and 614, to generate output 616.

Cell 600 includes a clock signal 618 that is directly input to the passgates 608 and 610. In this embodiment, the latches 602 and 604 are configured as p-first latches by directly inputting clock signal 618 into the p-inputs of the latches (passgates for the latches) 602 and 604. However, it should be understood that the latches 602 and 604 can be configured as n-first latches by directly driving the clock signal 618 into the n-inputs of the passgates 608 and 610. Clock signal 618 is also input to an inverter 620, which outputs an inverted clock signal to each passgate 608 and 610 for driving both passgates. By using a single inverter 620 to drive both passgates 608 and 610, the power consumption of cell 600 is reduced. The output of inverter 620 is input into the n-inputs of passgates 608 and 610. As discussed above, the output of inverter 620 can be input into the p-inputs of the passgates for a n-first latch configuration.

The data signal 612 is input to a first inverter 622 to drive the data signal 612 into passgate 608. The data signal 614 is input to a second inverter 624 to drive the data signal 614 into passgate 610. The passgates 608 and 610 act as gates for data signals 612 and 614 by holding the data until a low clock signal 618 is input to the passgates. Once the low clock signal is input to the passgates 608 and 610, the data signals 612 and 614 are allowed to pass. The data signals 612 and 614 are then input into respective latches 602 and 604 as well as gate 606. The gate 606 performs a logic operation on data signals 612 and 614 and generates output 616. Latches 602 and 604 can be configured in many ways. In this embodiment, latch 602 includes an inverter 626 that receives data signal 612 as an input after it passes passgate 608. Latch 602 also includes an inverter 628 that receives the output of inverter 626. Latch 604 includes an inverter 630 that receives data signal 614 as an input after it passes passgate 610. Latch 604 also includes an inverter 632 that receives the output of inverter 630.

Figure 7:
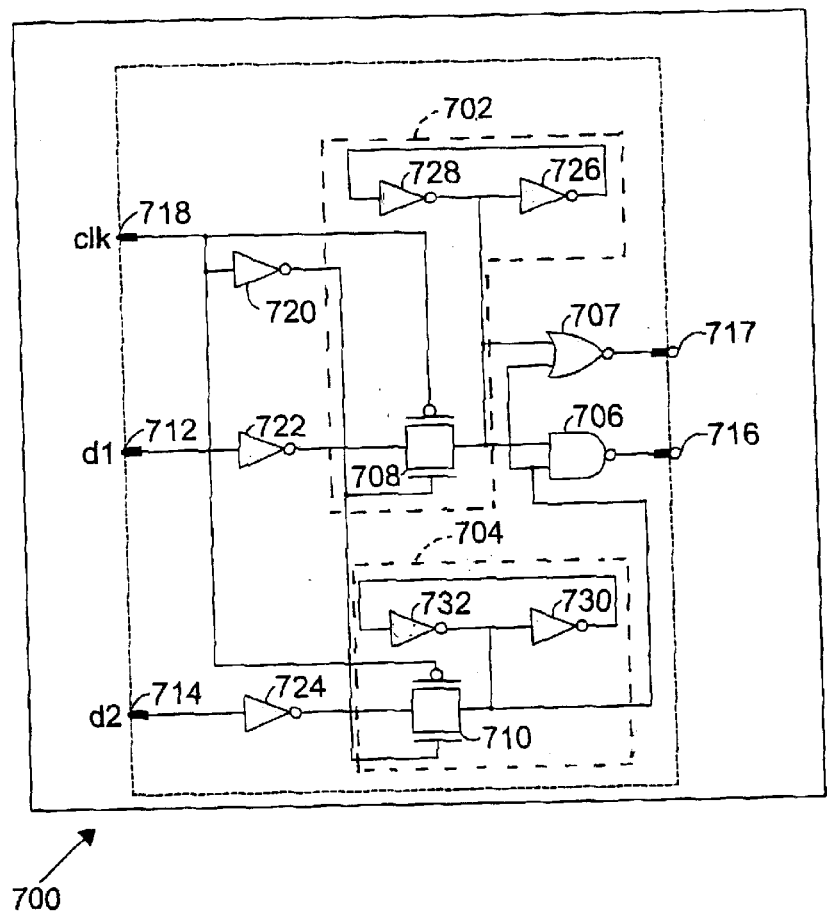
FIG. 7 illustrates a two input NAND gate and a two input NOR gate with p-first latches according to one embodiment of the present invention.

FIG. 7 shows an embodiment of the present invention. In FIG. 7, a logic cell 700 includes a first latch 702, a second latch 704, a NAND gate 706, a NOR gate 707, a first passgate 708 of the first latch 702, and a second passgate 710 of the second latch 704. The first latch 702 acts as a memory latch for a first data signal (d1) 712 that is input to the gates 706 and 707. The second latch 704 acts as a memory latch for a second data signal (d2) 714 that is input to the gates 706 and 707. The gates 706 and 707 perform logical operations (NAND and NOR) on the two inputs, 712 and 714, to generate output 716 for gate 706 and output 717 for gate 707.

FIG. 7 represents a circuit similar to that shown in FIG. 3 with a p-first structure for the passgates instead of an n-first structure. Cell 700 includes a clock signal 718 that is directly input to the passgates 708 and 710. In this embodiment, the latches 702 and 704 are configured as p-first latches by directly inputting clock signal 718 into the p-inputs of the latches (passgates for the latches) 702 and 704. However, it should be understood that the latches 702 and 704 can be configured as n-first latches by directly driving the clock signal 718 into the n-inputs of the passgates 708 and 710. Clock signal 718 is also input to an inverter 720, which outputs an inverted clock signal to each passgate 708 and 710 for driving both passgates. By using a single inverter 720 to drive both passgates 708 and 710, the power consumption of cell 700 is reduced. The output of inverter 720 is input into the n-inputs of passgates 708 and 710. As discussed above, the output of inverter 720 can be input into the p-inputs of the passgates for a n-first latch configuration.

The data signal 712 is input to a first inverter 722 to drive the data signal 712 into passgate 708. The data signal 714 is input to a second inverter 724 to drive the data signal 714 into passgate 710. The passgates 708 and 710 act as gates for data signals 712 and 714 by holding the data until a low clock signal 718 is input to the passgates. Once the low clock signal is input to the passgates 708 and 710, the data signals 712 and 714 are allowed to pass. The data signals 712 and 714 are then input into respective latches 702 and 704 as well as gates 706 and 707. The gates 706 and 707 perform a logic operation on data signals 712 and 714 and generate outputs 716 and 717. Latches 702 and 704 can be configured in many ways. In this embodiment, latch 702 includes an inverter 726 that receives data signal 712 as an input after it passes passgate 708. Latch 702 also includes an inverter 728 that receives the output of inverter 726. Latch 704 includes an inverter 730 that receives data signal 714 as an input after it passes passgate 710. Latch 704 also includes an inverter 732 that receives the output of inverter 730.

Figure 8:
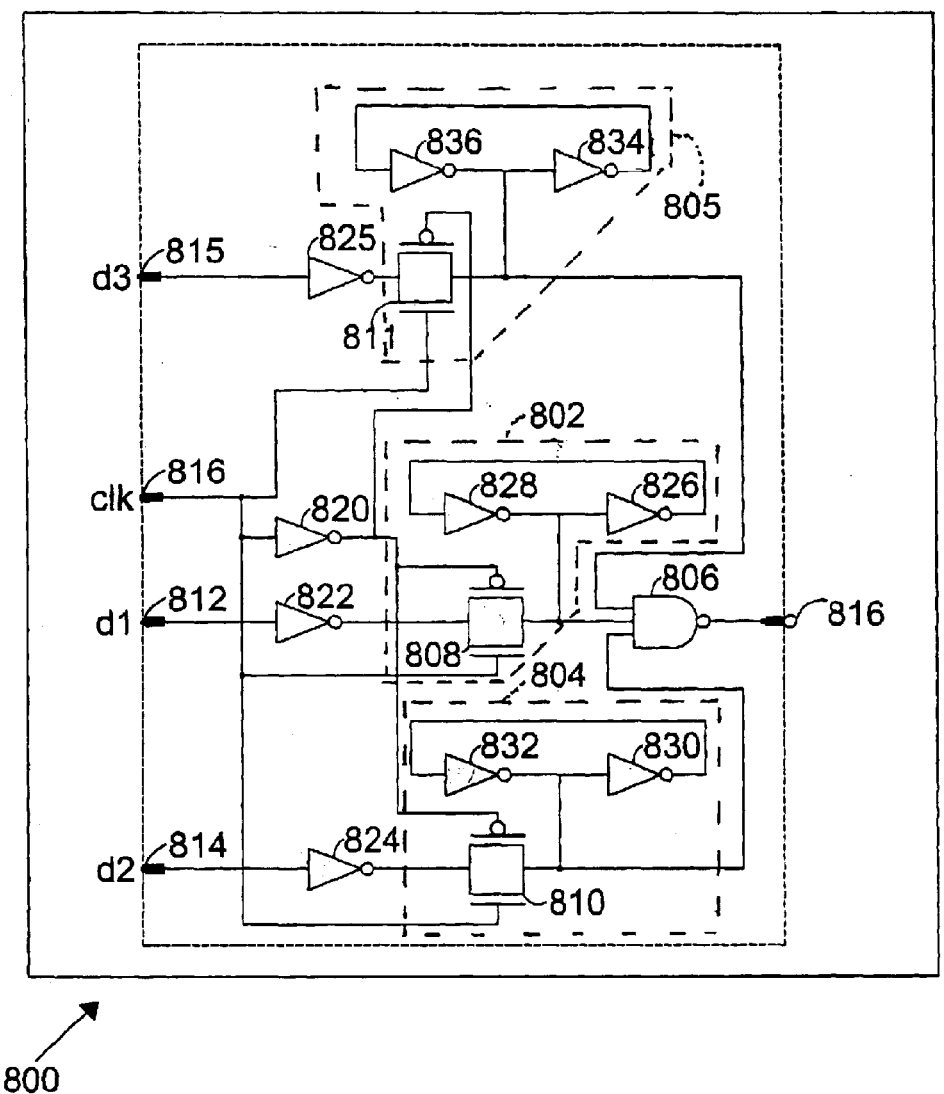
FIG. 8 illustrates a three input NAND gate with n-first latches according to one embodiment of the present invention.

FIG. 8 shows an embodiment of the present invention. In FIG. 8, a logic cell 800 includes a first latch 802, a second latch 804, a third latch 805, a NAND gate 806, a first passgate 808 of the first latch 802, a second passgate 810 of the second latch 804, and a third passgate 811 of the third latch 805. The first latch 802 acts as a memory latch for a first data signal (d1) 812 that is input to the gate 806. The second latch 804 acts as a memory latch for a second data signal (d2) 814 that is input to the gate 806. The third latch 805 acts as a memory latch for a third data signal (d3) 815 that is input to the gate 806. The gate 806 performs a logical operation (NAND) on the three inputs, 812, 814 and 815, to generate output 816.

Cell 800 includes a clock signal 818 that is directly input to the passgates 808, 810 and 811. In this embodiment, the latches 802, 4 and 8 are configured as n-first latches by directly inputting clock signal 818 into the n-inputs of the latches (passgates for the latches) 802, 804 and 805. However, it should be understood that the latches 802, 804 and 805 can be configured as p-first latches by directly driving the clock signal 818 into the p-inputs of the passgates 808, 810 and 811. Clock signal 818 is also input to an inverter 820, which outputs an inverted clock signal to each passgate 808, 810 and 811 for driving the passgates. By using a single inverter 820 to drive the passgates 808, 810 and 811, the power consumption of cell 800 is reduced. The output of inverter 820 is input into the p-inputs of passgates 808, 810 and 811. As discussed above, the output of inverter 820 can be input into the n-inputs of the passgates for a p-first latch configuration.

The data signal 812 is input to a first inverter 822 to drive the data signal 812 into passgate 808. The data signal 814 is input to a second inverter 824 to drive the data signal 814 into passgate 810. The data signal 815 is input to a third inverter 825 to drive the data signal 815 into passgate 811. The passgates 808, 810 and 811 act as gates for data signals 812, 814 and 815 by holding the data until a high clock signal 818 is input to the passgates. Once the high clock signal is input to the passgates 808, 810 and 811, the data signals 812, 814 and 815 are allowed to pass. The data signals 812, 814 and 815 are then input into respective latches 802, 804 and 805 as well as gate 806. The gate 806 performs a logic operation on data signals 812, 814 and 815 and generates output 816. Latches 802, 804 and 805 can be configured in many ways. In this embodiment, latch 802 includes an inverter 826 that receives data signal 812 as an input after it passes passgate 808. Latch 802 also includes an inverter 828 that receives the output of inverter 826. Latch 804 includes an inverter 830 that receives data signal 814 as an input after it passes passgate 810. Latch 804 also includes an inverter 832 that receives the output of inverter 830. Latch 805 includes an inverter 834 that receives data signal 815 as an input after it passes passgate 811. Latch 805 also includes an inverter 836 that receives the output of inverter 834. It should be understood that more than one logic gate may be used in cell 800 and more than two data signals may be input into cell 800 for use by the logic gate(s).

The embodiments described above illustrate embodiments using latches. However, it should be understood that the latches can be replaced with other sequential logic elements such as flip-flops. In addition, embodiments can use different sequential logic elements such as a flip-flop vectored with a latch. Further, a logic gate can be used on the data signals as opposed to an inverter before inputting the data signals to the sequential logic elements. It should be also understood that embodiments can use two or more data inputs, two or more sequential logic elements, or one or more logic gates and any combinations thereof. In addition, it should be understood that embodiments can use n-only and p-only structures instead of the n-first and p-first structures shown above.

Figure 9:
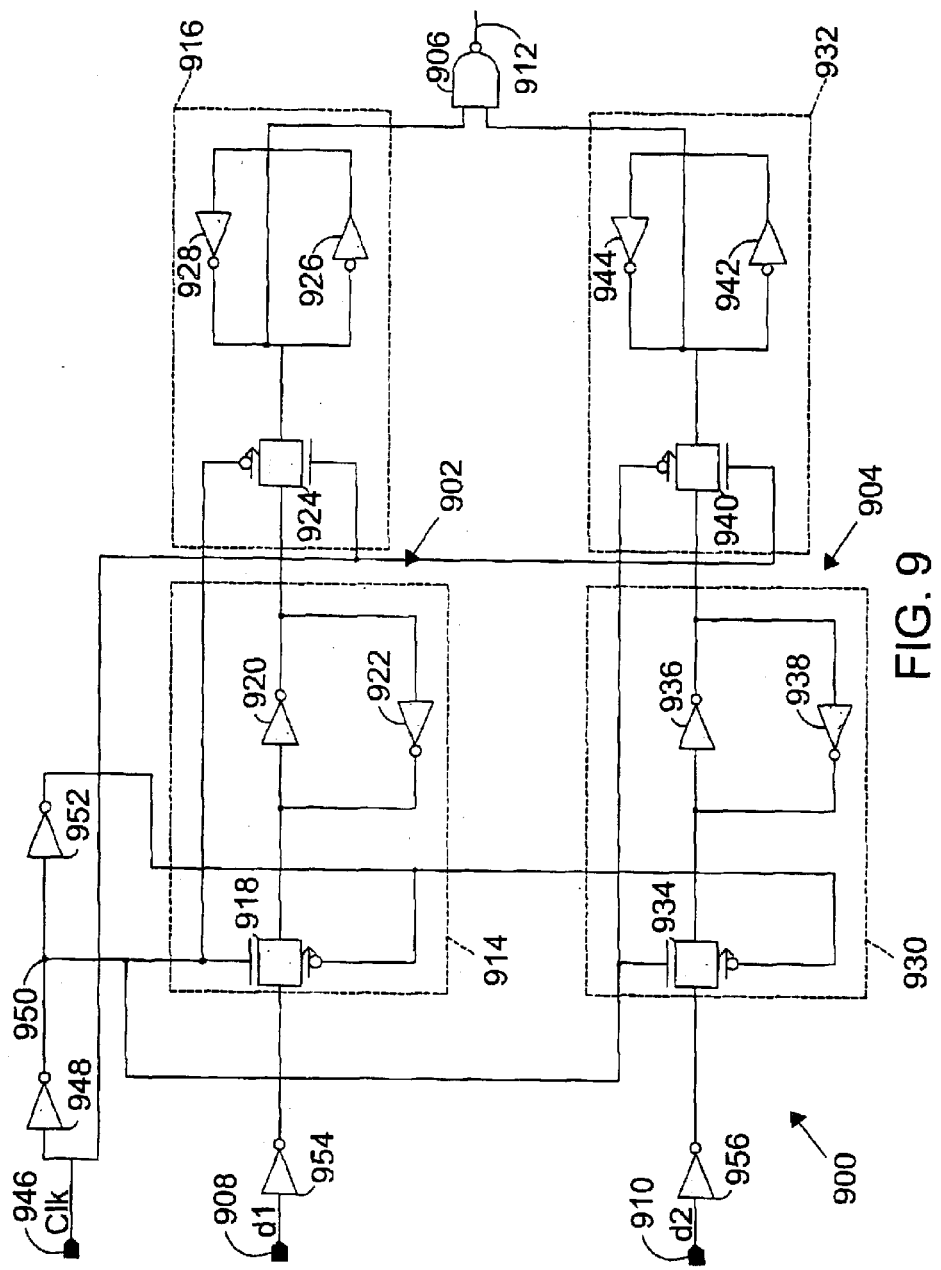
FIG. 9 illustrates a two input NAND gate with flip-flop sequential logic elements according to one embodiment of the present invention.

FIG. 9 shows an embodiment of the present invention using vectored (grouped/ganged) flip-flops. In this embodiment, a shared clock-driver is used between multiple flip-flops to avoid local clock driver underflow, the outputs of the multiple flip-flops contained within this cell are merged into a logic type (nand2) to provide one output, and the combination is created as a standard cell that is fully electrically characterizable and usable for timing analysis and layout placement. This arrangement provides a higher average logical effort per pipestage since the previous inaccessible inverting stages within flip-flops are now allowed to be logic-gates, a lower overall clock load because the clock driver is now shared between multiple gates, and the circuit remains electrically characterizable and placeable as a standard cell.

In FIG. 9, a logic cell 900 includes a first flip-flop 902, a second flip-flop 904, and a NAND gate 906. The first flip-flop 902 acts as a sequential logic element for a first data signal (d1) 908 that is input to the flip-flop 902. The second flip-flop 904 acts as a sequential logic element for a second data signal (d2) 910 that is input to the second flip-flop 904. The gate 906 performs a logical operation (NAND) on the two inputs, 908 and 910, to generate an output 912.

The first flip-flop 902 includes a master latch 914 and a slave latch 916. The master latch 914 includes a master passgate 918, a first master inverter 920, and a second master inverter 922. The slave latch 916 includes a slave passgate 924, a first slave inverter 926, and a second slave inverter 928. The second flip-flop 904 includes a master latch 930 and a slave latch 932. The master latch 930 includes a master passgate 934, a first master inverter 936, and a second master inverter 938. The slave latch 932 includes a slave passgate 940, a first slave inverter 942, and a second slave inverter 944.

Cell 900 includes a clock signal 946 that is input to the n-inputs of passgates 924 and 940. In addition, clock signal 946 is coupled to a first clock inverter 948 to generate a complement clock signal 950. The signal 950 is input to the n-inputs of passgates 918 and 934 and input to the p-inputs of passgates 924 and 940. The signal 950 is coupled to a second clock inverter 952. The output of inverter 952 is input to the p-inputs of passgates 918 and 934. It should be understood that the clock inputs to the various passgates can be configured so that cell 900 has p-first master and p-first slave latches or n-first master and n-first slave latches depending on which clock signal is input to the p- or n-inputs of the various passgates.

The data signal 908 is input to a first data inverter 954 to drive the data signal 908 into passgate 918. The data signal 910 is input to a second data inverter 956 to drive the data signal 910 into passgate 934. The passgates 918 and 934 act as gates for data signals 908 and 910 by holding the data until a clock signal 950 is input to the passgates. Once the clock signal is input to the passgates 918 and 934, the data signals 908 and 910 are allowed to pass. The data signals 908 and 910 are then input into respective master latches 914 and 930. The output of master latches 914 and 930 are input to the passgates 924 and 940 respectively. The clock signal 946 controls the input of the data signals 908 and 910 into respective slave latches 916 and 932 as well as gate 906. The gate 906 performs a logic operation on data signals 908 and 910 and generates output 912. The data inverters 954 and 956 can be replaced with any logic gate such as a NAND or NOR gate (with multiple data inputs or a clock input). In addition, cell 900 can be configured to include more than two input signals with or without logic gates in place of the input inverters, more than two flip-flops or a combination of flip-flops and latches, and more than one logic gate of any type (NAND), NOR etc.) for the output.

Figure 10:
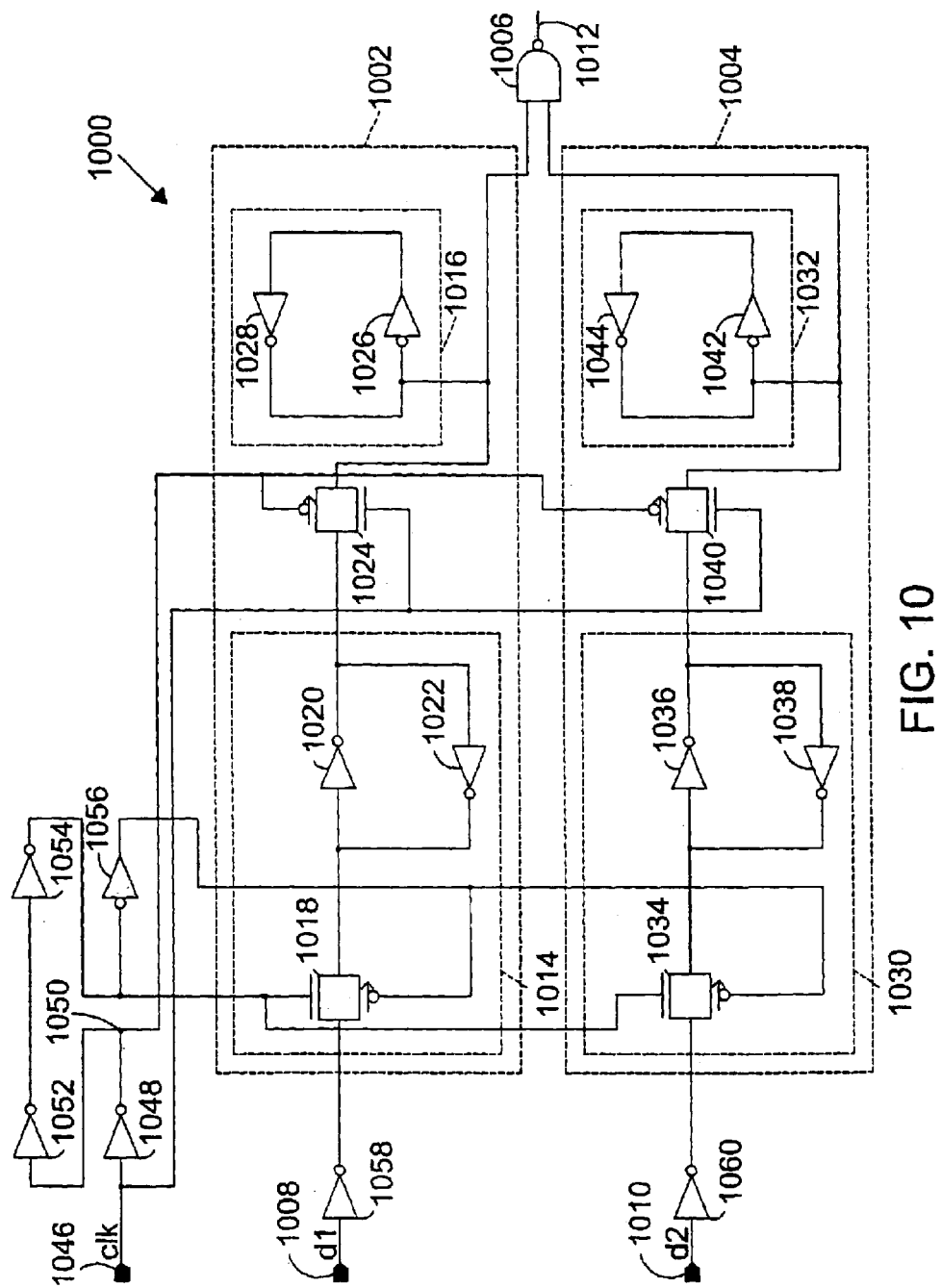
FIG. 10 illustrates a two input NAND gate with additional clock inverters for time borrowing between master and slave latches of the flip-flops according to one embodiment of the present invention.

In FIG. 10, a logic cell 1000 includes a first flip-flop 1002, a second flip-flop 1004, and a NAND gate 1006. The first flip-flop 1002 acts as a sequential logic element for a first data signal (d1) 1008 that is input to the flip-flop 1002. The second flip-flop 1004 acts as a sequential logic element for a second data signal (d2) 1010 that is input to the flip-flop 1004. The gate 906 performs a logical operation (NAND) on the two inputs, 1008 and 1010, to generate an output 1012.

The first flip-flop 1002 includes a master latch 1014 and a slave latch 1016. The master latch 1014 includes a master passgate 1018, a first master inverter 1020, and a second master inverter 1022. The slave latch 1016 includes a slave passgate 1024, a first slave inverter 1026, and a second slave inverter 1028. The second flip-flop 1004 includes a master latch 1030 and a slave latch 1032. The master latch 1030 includes a master passgate 1034, a first master inverter 1036, and a second master inverter 1038. The slave latch 1032 includes a slave passgate 1040, a first slave inverter 1042, and a second slave inverter 1044.

Cell 1000 includes a clock signal 1046 that is input to the n-inputs of passgates 1024 and 1040. In addition, clock signal 1046 is coupled to a first clock inverter 1048 to generate a complement clock signal 1050. The signal 1050 is input to the p-inputs of passgates 1024 and 1040. The signal 1050 is coupled to a second clock inverter 1052 and a third clock inverter 1054. The inverters 1052 and 1054 provide two additional inversions of the clock signal that allows time borrowing between the master and slave latches in the cell 1000. The output of inverter 1054 is input to the n-inputs of passgates 1018 and 1034 and a fourth clock inverter 1056. The output of the fourth clock inverter 1056 is input to the p-inputs of passgates 1018 and 1034. It should be understood that the clock inputs to the various passgates can be configured so that cell 1000 has p-first master and p-first slave latches or n-first master and n-first slave latches depending on which clock signal is input to the p- or n-inputs of the various passgates.

The data signal 1008 is input to a first data inverter 1058 to drive the data signal 1008 into passgate 1018. The data signal 1010 is input to a second data inverter 1060 to drive the data signal 1010 into passgate 1034. The passgates 1018 and 1034 act as gates for data signals 1008 and 1010 by holding the data until a clock signal from the output of third clock inverter 1054 is input to the passgates. Once the clock signal is input to the passgates 1018 and 1034, the data signals 1008 and 1010 are allowed to pass. The data signals 1008 and 1010 are then input into respective master latches 1014 and 1030. The output of master latches 1014 and 1030 are input to the passgates 1024 and 1040 respectively. The clock signal 1046 controls the input of the data signals 1008 and 1010 into respective slave latches 1016 and 1032 as well as gate 1006. The gate 1006 performs a logic operation on data signals 1008 and 1010 and generates output 1012. The data inverters 1058 and 1060 can be replaced with any logic gate such as a NAND or NOR gate (with multiple data inputs or a clock input). In addition, cell 1000 can be configured to include more than two input signals with or without logic gates in place of the input inverters, more than two flip-flops or a combination of flip-flops and latches, and more than one logic gate for the output. This embodiment can also be modified to include n-only or p-only passgates or a combination of n-only, p-only, n-first, and p-first passgates.

Figure 11:
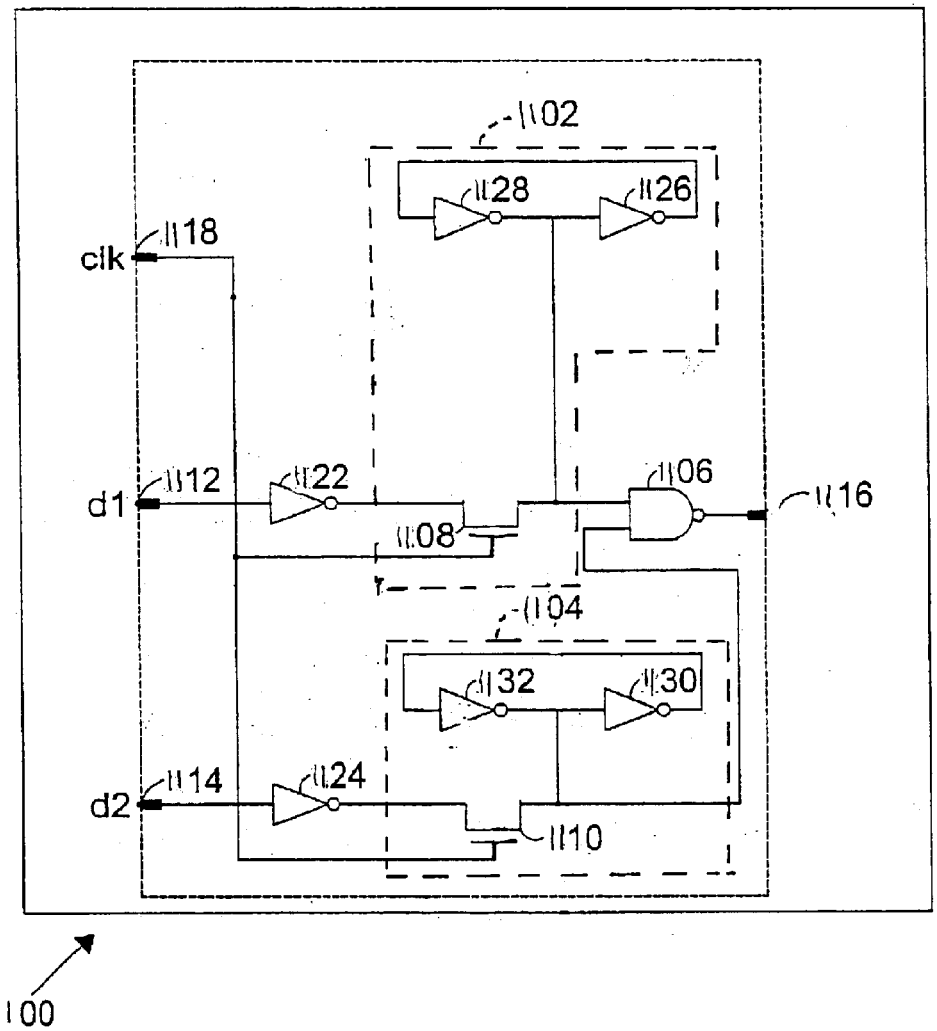
FIG. 11 illustrates a two input NAND gate with n-only latches according to one embodiment of the present invention.

FIG. 11 shows an embodiment of the present invention using vectored (grouped/ganged) latches with n-only passgates. It should be understood that embodiments can also use p-only passgates as well as n-first and p-first or any combination thereof (such as an n-only and a n-first passgate). In addition, it should be understood that embodiments can use other sequential logic elements such as flip-flops in place of latches with n-only, p-only, or a combination. In FIG. 11, a logic cell 1100 includes a first latch 1102, a second latch 1104, a NAND gate 1106, a first passgate 1108 of the first latch 1102, and a second passgate 1110 of the second latch 1104. The first latch 1102 acts as a memory latch for a first data signal (d1) 1112 that is input to the gate 1106. The second latch 1104 acts as a memory latch for a second data signal (d2) 1114 that is input to the gate 1106. The gate 1106 performs a logical operation (NAND) on the two inputs, 1112 and 1114, to generate output 1116.

Cell 1100 includes a clock signal 1118 that is directly input to the passgates 1108 and 1110. In this embodiment, the latches 1102 and 1104 are configured as n-only latches by directly inputting clock signal 1118 into the n-inputs of the latches (passgates for the latches) 1102 and 1104. However, it should be understood that the latches 1102 and 1104 may be configured as p-only latches by directly driving the clock signal 1118 into the p-inputs of the passgates 1108 and 1110. Clock signal 1118 is also input to an n-input of each passgate 1108 and 1110 for driving both passgates. By using a clock signal 1118 to drive both passgates 1108 and 1110, the power consumption of cell 1100 is reduced.

The data signal 1112 is input to a first inverter 1122 to drive the data signal 1112 into passgate 1108. The data signal 1114 is input to a second inverter 1124 to drive the data signal 1114 into passgate 1110. The passgates 1108 and 1110 act as gates for data signals 1112 and 1114 by holding the data until a high clock signal 1118 is input to the passgates. Once the high clock signal is input to the passgates 1108 and 1110, the data signals 1112 and 1114 are allowed to pass. The data signals 1112 and 1114 are then input into respective latches 1102 and 1104 as well as gate 1106. The gate 1106 performs a logic operation on data signals 1112 and 1114 and generates output 1116. Latches 1102 and 1104 can be configured in many ways. In this embodiment, latch 1102 includes an inverter 1126 that receives data signal 1112 as an input after it passes passgate 1108 (also part of latch 1102). Latch 1102 also includes an inverter 1128 that receives the output of inverter 1126. Latch 1104 includes an inverter 1130 that receives data signal 1114 as an input after it passes passgate 1110 (also part of latch 1104). Latch 1104 also includes an inverter 1132 that receives the output of inverter 1130.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An apparatus, comprising:
    a clock driver circuit element to receive a clock signal and to produce a shared clock signal;
    a first gate to receive a first data signal and to receive the shared clock signal from the clock driver circuit element, and to output the first data signal in response to the shared clock signal;
    a second gate to receive a second data signal and to receive the shared clock signal from the clock driver circuit element, and to output the second data signal in response to the shared clock signal;
    a first sequential logic element to receive the first data signal from the first gate, and to store the first data signal;
    a second sequential logic element to receive the second data signal from the second gate, and to store the second data signal; and
    a logic gate to receive the first data signal directly from the first gate and the second data signal directly from the second gate, and to generate an output by performing a logical operation on the first data signal and the second data signal.

2. The apparatus of claim 1, wherein the first sequential logic element includes the first gate.

3. The apparatus of claim 2, wherein the second sequential logic element includes the second gate.

4. The apparatus of claim 1, wherein the first gate is configured as one of an n-first gate and an n-only gate.

5. The apparatus of claim 4, wherein the second gate is configured as one of an n-first gate and an n-only gate.

6. The apparatus of claim 1, wherein the first gate is configured as one of a p-first gate and a p-only gate.

7. The apparatus of claim 6, wherein the second gate is configured as one of a p-first gate and a p-only gate.

8. The apparatus of claim 1, further comprising:
    a third gate to receive a third data signal and to receive the shared clock signal from the clock driver circuit element, and to output the third data signal in response to the shared clock signal; and
    a third sequential logic element to receive the third data signal from the third gate, and to store the third data signal;
    wherein the third data signal is directly input to the logic gate and the logic gate generates the output by performing a logical operation on the first data signal, the second data signal and the third data signal.

9. The apparatus of claim 1, wherein the logic gate is a plurality of logic gates to generate a plurality of outputs by performing logic operations on the first data signal and the second data signal.

10. The apparatus of claim 1, wherein the first sequential logic element is one of a latch and a flip-flop.

11. The apparatus of claim 10, wherein the second sequential logic element is one of a latch and a flip-flop.

12. The apparatus of claim 1, wherein the first sequential logic element is a latch and the second sequential logic element is a flip-flop.

13. The apparatus of claim 1, wherein the clock driver circuit element comprises an inverter circuit.

14. An apparatus, comprising:
    a first inverter to receive a shared clock signal, and to output an inverted shared clock signal;
    a first gate to receive a first data signal, one of the shared clock signal and the inverted shared clock signal from the first inverter, and to output the first data signal in response to one of the shared clock signal and the inverted shared clock signal;
    a second gate to receive a second data signal, one of the shared clock signal and the inverted shared clock signal from the first inverter, and to output the second data signal in response to one of the shared clock signal and the inverted shared clock signal;
    a first sequential logic element to receive the first data signal from the first gate, and to store the first data signal;
    a second sequential logic element to receive the second data signal from the second gate, and to store the second data signal; and
    a logic gate to receive the first data signal directly from the first gate and the second data signal directly from the second gate, and to generate an output by performing a logical operation on the first data signal and the second data signal.

15. The apparatus of claim 14, wherein the first gate is a passgate for the first sequential logic element.

16. The apparatus of claim 15, wherein the second gate is a passgate for the second sequential logic element.

17. The apparatus of claim 14, wherein the first gate is configured as one of an n-first gate and an n-only gate.

18. The apparatus of claim 17, wherein the second gate is configured as one of an n-first gate and an n-only gate.

19. The apparatus of claim 14, wherein the first gate is configured as one of a p-first gate and a p-only gate.

20. The apparatus of claim 19, wherein the second gate is configured as one of a p-first gate and a p-only gate.

21. The apparatus of claim 14, further comprising:
    a third gate to receive a third data signal, one of the shared clock signal and the inverted shared clock signal from the first inverter, and to output the third data signal in response to one of the shared clock signal and the inverted shared clock signal; and
    a third sequential logic element to receive the third data signal from the third gate, and to store the third data signal;
    wherein the third data signal is directly input to the logic gate and the logic gate generates the output by performing a logical operation on the first data signal, the second data signal and the third data signal.

22. The apparatus of claim 14, wherein the logic gate is a plurality of logic gates to generate a plurality of outputs by performing logic operations on the first data signal and the second data signal.

23. The apparatus of claim 14, wherein the first gate to output the first data signal and the second gate to output the second data signal in response to a same one of the shared clock signal and the inverted shared clock signal.

24. A method, comprising:

generating a shared clock signal;

generating an inverted shared clock signal;

inputting a first data signal to a first passgate;

inputting a second data signal to a second passgate;

inputting a third data signal to a third passgate;

driving the first data signal through the first passgate and the second data signal through the second passgate with one of the shared clock signal and the inverted shared clock signal;

driving the third data signal through the third passgate with one of the shared clock signal and the inverted shared clock signal;

storing the first data signal in a first sequential logic element;

storing the second data signal in a second sequential logic element; a storing the third data signal in a third sequential logic element;

driving the first data signal and the second data signal through a logic gate using the first passgate and the second passgate; and driving the third data signal through the logic gate using the third passgate.

25. The method of claim 24, further comprising:

performing a logical operation on the first data signal and the second data signal; and outputting an output based on the performed logical operation.

26. The method of claim 24, further comprising:

driving the first data signal and the second data signal through a second logic gate using the first passgate and the second passgate.

27. The method of claim 24, wherein driving the first data signal through the first passgate and the second data signal through the second passgate comprises driving the first passgate and the second passgate with a same one of the shared clock signal and the inverted shared clock signal.

28. A system, comprising:

a processor; and a cache in communication with the processor;

wherein the processor comprises:

a clock driver circuit element to receive a clock signal and to produce a shared clock signal;

a first gate to receive a first data signal and to receive the shared clock signal from the clock driver circuit element, and to output the first data signal in response to the shared clock signal;

a second gate to receive a second data signal and to receive the shared clock signal from the clock driver circuit element, and to output the second data signal in response to the shared clock signal;

a first sequential logic element to receive the first data signal from the first gate, and to store the first data signal;

a second sequential logic element to receive the second data signal from the second gate, and to store the second data signal; and a logic gate to receive the first data signal directly from the first gate and the second data signal directly from the second gate, and to generate an output by performing a logical operation on the first data signal and the second data signal.

29. The system of claim 28, wherein the logic gate is a plurality of logic gates to generate a plurality of outputs by performing logic operations on the first data signal and the second data signal.

30. A storage device, comprising:

a first latch;

a second latch;

a clock generator to generate a clock signal to simultaneously drive the first latch based on the clock signal and the second latch based on the clock signal;

a first signal generator to generate a first output signal based on outputs of the first latch and the second latch; and a second signal generator to generate a second output signal based on the outputs of the first latch and the second latch, the first output signal and second output signal being different logical values when the outputs of the first latch and the second latch are different logical values.

31. The storage device of claim 30, wherein the first latch and the second latch are connected to different data input lines.

32. The storage device of claim 30, wherein the first signal generator generates a first logical value when the outputs of the first latch and second latch both equal said first logical value.

33. The storage device of claim 32, wherein the first logical value is a logical zero.

34. The storage device of claim 32, wherein the first logical value is a logical one.

35. The storage device of claim 30, wherein the first signal generator generates a predetermined logical value when the outputs of the first latch and second latch are different logical values.

36. The storage device of claim 35, wherein the predetermined logical value is a logical one.

37. The storage device of claim 30, wherein the first signal generator includes only one logic gate.

* * * * *